United States Patent [19]
Ghandehari et al.

[11] Patent Number: 6,057,587
[45] Date of Patent: May 2, 2000

[54] SEMICONDUCTOR DEVICE WITH ANTI-REFLECTIVE STRUCTURE

[75] Inventors: Kouros Ghandehari; Samit Sengupta, both of San Jose, Calif.

[73] Assignee: VLSI Technology, Inc., San Jose, Calif.

[21] Appl. No.: 08/919,911

[22] Filed: Aug. 28, 1997

[51] Int. Cl.$^7$ ............... H01L 31/0232; H01L 23/48; H01L 23/52; H01L 29/40

[52] U.S. Cl. ............... 257/437; 257/435; 257/436; 257/749

[58] Field of Search ............... 257/437, 435, 257/436, 749

[56] References Cited

U.S. PATENT DOCUMENTS

| | | | |
|---|---|---|---|
| 4,117,506 | 9/1978 | Carlson et al. | 257/437 |
| 4,330,680 | 5/1982 | Goetzberger | 136/247 |
| 5,101,260 | 3/1992 | Nath et al. | 357/67 |
| 5,291,036 | 3/1994 | Tran et al. | 257/53 |
| 5,528,071 | 6/1996 | Russell et al. | 257/458 |
| 5,718,773 | 2/1998 | Shiozaki | 257/437 |
| 5,808,315 | 9/1998 | Murakami et al. | 257/59 |

OTHER PUBLICATIONS

Löbl, H. et al., "ITO Films for Antireflective and Antistatic Tube Coatings Prepared by D.C. Magnetron Sputtering", *Surface and Coatings Technology,* 82: 90–98 (1996).

Forouhi, A. et al., "Optical Characterization of ITO Films used in Flat Panel Displays", *SPIE,* 2725: 471–477 (Apr. 1996).

*Primary Examiner*—David Hardy
*Assistant Examiner*—Jesse A. Fenty

[57] ABSTRACT

A semiconductor devices includes an anti-reflective structure for use in patterning metal layers in semiconductor devices. The anti-reflective structure is made, at least in part, using indium tin oxide. The anti-reflective structure is especially useful for patterning the metal layers with light having a wavelength of 190–300 nm. The anti-reflective structure may be a single indium tin oxide layer or may include a titanium nitride layer formed over the metal layer and an indium tin oxide layer formed over the titanium nitride layer. For many applications, the anti-reflective structure, in the presence of a photoresist layer, has a reflectivity of about 3% or less for light having a wavelength of 190–300 nm.

24 Claims, 4 Drawing Sheets

SEMICONDUCTOR DEVICE WITH ANTI-REFLECTIVE STRUCTURE

FIELD OF THE INVENTION

The present invention is, in general, directed to a semiconductor device having an anti-reflective structure. In particular, the present invention relates to a semiconductor device with an anti-reflective structure which contains indium tin oxide and is especially useful for patterning metal layers with light having a wavelength between about 190 to about 300 nm.

BACKGROUND OF THE INVENTION

Over the last few decades, the electronics industry has undergone a revolution through the use of semiconductor technology to fabricate small, highly integrated electronic devices. As these devices become smaller, there is a need for forming increasingly narrow conductive lines and interconnects in these devices. Many of these conductive lines and interconnects are formed using metals, including, for example, aluminum or copper. A layer of the metal is often formed over the substrate and previously formed layers of the device and then the metal layer is patterned to form the conductive lines and interconnects. A standard patterning technique is photolithography, in which a photoresist is deposited over the layer of metal and a mask is used to expose the photoresist with light which is passed through the mask. The machines used today are referred to as steppers or scanners and the pattern created by the mask can be the same size as the mask or reduced by a factor of, for example, five or ten. After exposure to light, the photoresist is developed, for example, by rinsing in a developing solution. The metal layer can then be etched to remove the unwanted material according to the desired pattern.

The wavelength of light used to expose the photoresist will typically determine the minimum size of a feature that can be patterned. Current 0.25 µm generation design rules call for patterning 0.4 µm lines and spaces in the metal interconnect layers. The exposure wavelength for patterning the photoresist for 0.4 µm design rules is typically 365 nm. For more aggressive gate layer design rules, requiring 0.25 µm lines and spaces, the exposure wavelength is 248 nm.

Future CMOS devices are expected to have gatewidths of about 0.18 µm and metal line widths and spaces of about 0.3 µm. This will require light with shorter wavelengths. One convenient wavelength is 248 nm, available from a KrF laser. Furthermore, CMOS devices may be designed with 0.13 µm or smaller gatewidths. These devices will require photoresist patterning with even shorter wavelengths, including, for example, the 193 nm line of an ArF laser.

One particular difficulty with patterning metal layers is the inherent reflectivity of the metal. High reflectivity can distort the mask image in the photoresist. In general, there are three phenomena which degrade the resist image on reflective surfaces, such as metal or silicon. First, standing waves can be generated within the resist in the vertical direction due to the constructive and destructive interference of the incident and reflected light. Standing waves in the resist profile produce vertical waves in the resist which can lead to etching problems. A second effect, referred to as "swing", occurs when there is a change in the resist thickness due to a topographical change in the underlying layers (e.g., a change in thickness of the underlying layers). The horizontal width of the line is affected due to the path length difference of light reflected from either side of the topographical feature. The third effect is called "reflective notching" and occurs when the topography of the underlying surface (e.g., a slope in the topography) causes the reflection of light at angles which are not perpendicular to the surface of the photoresist. The reflected light then exposes portions of the photoresist which results in the removal of inappropriate portions of the desired lines (i.e., notches in the lines). Thus, to properly expose the resist, the reflectivity of the substrate below the resist must be very low. Ideally, this reflectivity should be 3% or less.

Aluminum and copper are commonly used metals for conductive lines and interconnects in semiconductor devices. These metals have reflectivities of about 80–90%. Therefore, an anti-reflective structure is applied over the metal layer prior to applying the photoresist. One commonly used anti-reflective structure is titanium nitride (TiN), which has a low reflectivity at 365 nm. However, at 248 nm, the reflectivity of titanium nitride is much greater than 3% and the reflectivity of titanium nitride is even larger for 193 nm light.

SUMMARY OF THE INVENTION

Generally, the present invention relates to a method of manufacturing a semiconductor device with an anti-reflective structure for use in patterning metal layers. One embodiment is a method of making a semiconductor device which includes forming a metal layer over a substrate of the semiconductor device. An anti-reflective coating is then formed over the metal layer. The anti-reflective coating is made with indium tin oxide. A photoresist layer is formed over the anti-reflective coating. In the presence of the photoresist layer, the anti-reflective coating reflects no greater than about 3% of light having a wavelength within the range of 190–300 nm.

In another embodiment, the anti-reflective coating includes two sublayers. The first sublayer is formed over the metal layer and contains titanium nitride. The second sublayer is formed over the first sublayer and contains indium tin oxide.

A further embodiment is a method of making a semiconductor device by forming a metal layer over a substrate of the semiconductor device. An anti-reflective coating is formed over the metal layer. The anti-reflective coating is made with indium tin oxide. A photoresist layer is then formed over the anti-reflective coating. The photoresist layer is irradiated with light having a wavelength from about 190 to about 300 nm to generate a pattern in the resist layer. In the presence of the photoresist layer, the anti-reflective coating reflects less than about 3% of the light. Following the illumination, a portion of the metal layer is removed according to the pattern.

Another embodiment is a semiconductor device having a substrate and a metal layer formed over the substrate. An anti-reflective coating is formed over the metal layer. The anti-reflective coating includes indium tin oxide. A photoresist layer is formed over the anti-reflective layer. In the presence of the photoresist layer, the anti-reflective coating reflects less than about 3% of light having one or more wavelengths within the range of 190–300 nm.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
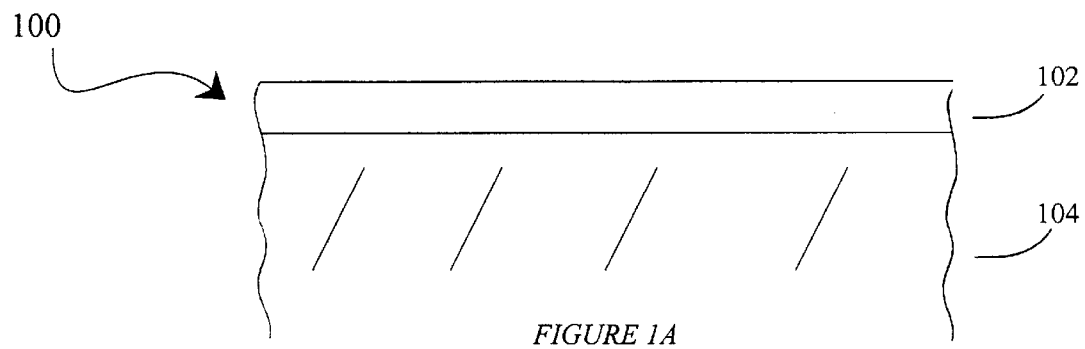
FIGS. 1A–1E illustrate an exemplary process for patterning a metal layer of a semiconductor device using an anti-reflective layer according to the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE ILLUSTRATED EMBODIMENTS

The present invention is believed to be applicable to a number of semiconductor devices which have patterned metal layers including, for example, conductive lines or interconnects and vias between levels of the device. The anti-reflective coating may also be used with other layers, especially those which reflect more than about 3% of the light which will be used to pattern the layer. While the present invention is not so limited, an appreciation of various aspects of the invention will be gained through a discussion of the fabrication process in connection with the examples provided below.

FIGS. 1A–1E illustrate one exemplary process for producing an improved anti-reflective coating. A semiconductor device 100 has a metal layer 102 formed on a substrate 104, as illustrated in FIG. 1A. The metal layer 102 is, for example, aluminum, copper, or another conductive metal or alloy. The metal layer 102 may be formed on the substrate 104 by metallization techniques, including, for example, sputtering or physical vapor deposition. Typically, the metal layer has a thickness of about 2000–10,000 angstroms.

The substrate may include a silicon wafer and layers of material deposited on the silicon wafer including, for example, dielectric layers, other metal layers, polysilicon layers, etc. which form a structure underlying the metal layer 102. Furthermore, the metal layer 102 may be connected to other metal layers or other structural elements on or in the substrate 104 by vias (not shown). For example, the metal layer 102 may be connected by a via to a previously deposited metal layer. In some cases, an adhesion layer (not shown) is deposited between the metal layer 102 and the substrate 104. The adhesion layer may be, for example, titanium, titanium nitride, or tantalum. The adhesion layer typically increases the adherence of the metal layer 102 to the underlying substrate 104.

Figure 1B:
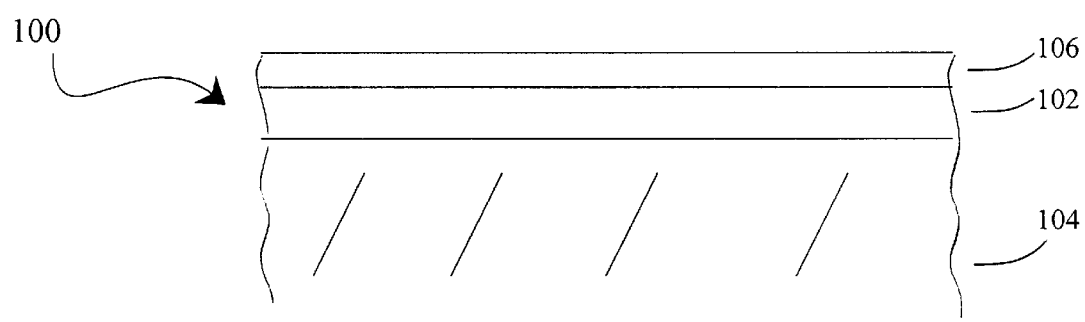
Figure 1C:
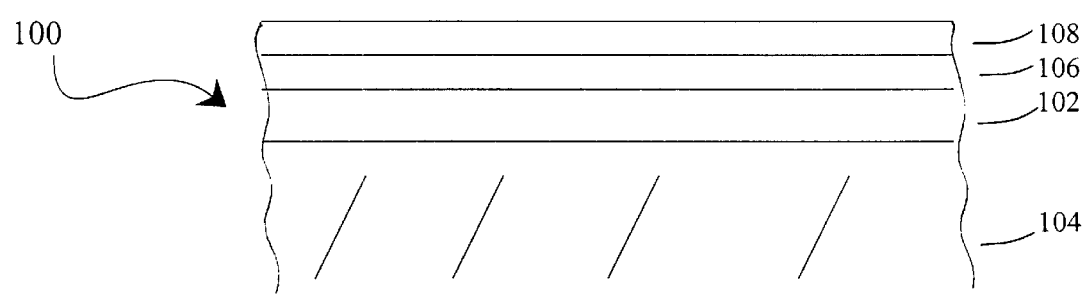

An anti-reflective structure 106 is provided over the metal layer 102, as illustrated in FIG. 1B. The anti-reflective structure 106 includes indium tin oxide (ITO). An indium tin oxide structure can be provided on the metal layer 102 by a variety of techniques, including, for example, sputtering, chemical vapor deposition, or physical vapor deposition. For example, a metallic indium tin target may be used in the presence of oxygen gas for sputtering an indium tin oxide structure on the metal layer 102. The stoichiometry of the indium tin oxide may vary and depends on factors such as the composition of the metallic indium tin target and the partial pressure of the oxygen in the deposition chamber. The ratio of indium to tin can vary over a wide range. As an example, a ratio of indium to tin between about 80:20 to about 95:5 is believed to be useful in forming the anti-reflective structure.

The amount of oxygen may also be varied. Stoichiometric amounts of oxygen (3 moles of oxygen for every 2 moles of indium or tin) may be used, i.e., $(In_xSn_{1-x})O_3$. Preferably, x is about 0.8 to about 0.95. In other embodiments, the indium tin oxide may be either oxygen deficient (i.e., have a substoichiometric amount of oxygen) or oxygen rich (i.e., have a superstoichiometric amount of oxygen). The particular properties of the indium tin oxide may vary depending on the amount of oxygen and the ratio of indium to tin.

A photoresist layer 108 is formed over the anti-reflective structure 106. The photoresist layer 108 can be formed by a variety of technique from the field of photolithography. An array of useful photoresists exist. The particular choice of photoresist may be limited by the wavelength of light with which the photoresist will be illuminated, as described hereinbelow. Examples of suitable photoresists include Shipley UV5 and TOK DP019 for use with 248 nm light.

Figure 1D:
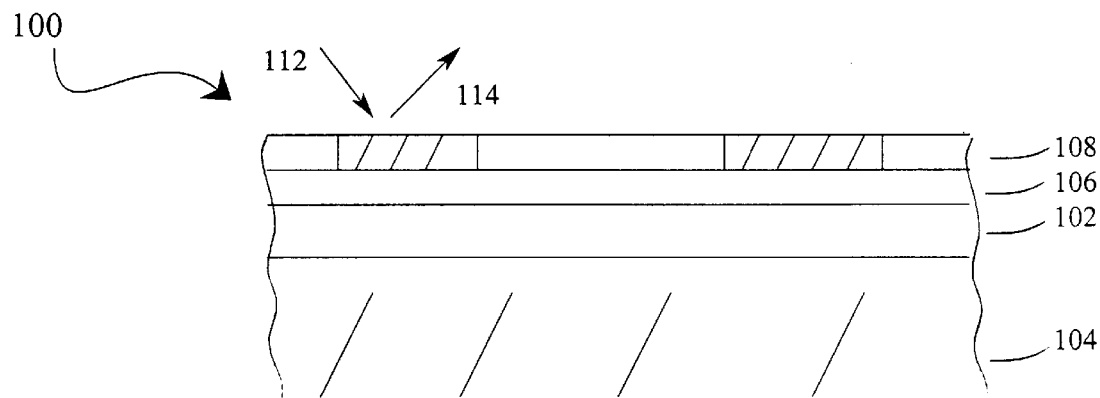

A mask (not shown) is used to pattern the photoresist layer 108 as the photoresist layer 108 is exposed to light 112 having a particular wavelength, as shown in FIG. 1D. The mask may be designed to only expose those portions of the resist that are to be removed (i.e., a positive mask) or may expose those portions of the resist that are to remain and protect the underlying layers during the etching process (i.e., a negative mask). The type of mask that is used will typically depend on the photoresist and the subsequent developing steps.

The particular wavelengths of interest for the anti-reflective structure 106 made with indium tin oxide are in the deep ultraviolet and ultra-deep ultraviolet regions of the spectrum which includes the range from about 190 to about 300 nm. Light having a wavelength within this range can be used to pattern CMOS gates with widths of 0.18 μm or smaller and conductive lines and spaces with widths of 0.3 μm or smaller. The light 112 can be provided by a variety of sources and is often monochromatic. Lasers provide an excellent source of monochromatic light. In particular, the 248 nm line of a KrF laser and the 193 nm line of an ArF laser can be used. In addition, polychromatic sources such as deuterium, mercury, or xenon lamps, may be used with a narrow bandpass filter that limits the light which exposes the resist to a relatively narrow bandwidth.

The presence of the anti-reflective structure 106 minimizes the amount of reflected light 114. This typically reduces the error introduced in the pattern due to, for example, reflections from the metal surface, as described above.

Figure 1E:
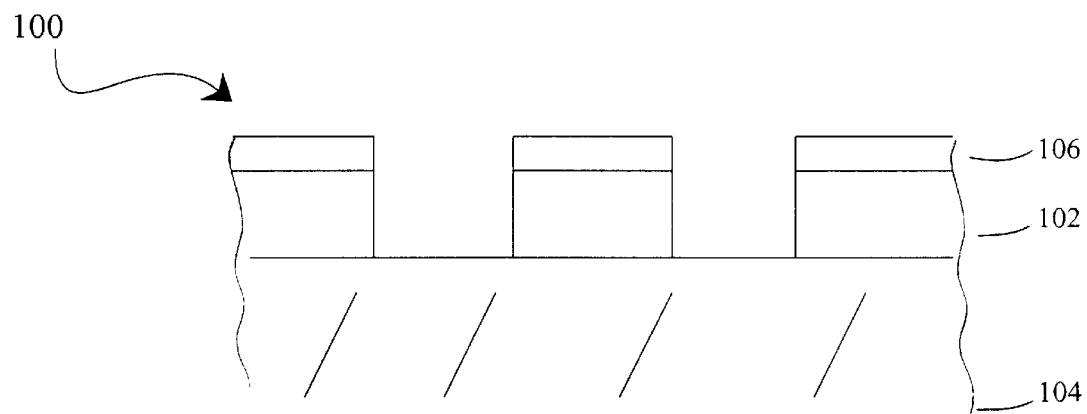

Once the photoresist layer 108 is patterned, the photoresist layer is developed in a suitable developing solution. Portions of the anti-reflective structure 106 and the metal layer 102 can then be removed, as shown in FIG. 1E, according to the pattern, using standard techniques, including, for example, wet etching, dry etching, plasma etching, and anisotropic plasma etching.

The thickness of the anti-reflective structure, as well as its composition, determines the optical properties of structure. When illuminated with light having a wavelength of interest, a suitable anti-reflective structure for use in patterning metal layers should have a reflectivity of 3% or less in the presence of the photoresist. This low level of reflectivity will be useful in many applications, including, for example, semiconductor device having conductive lines for which parameters such as conductivity can vary over a substantial range without affecting the overall operation of the device.

In many standard applications including, for example, the patterning of conductive lines which frequently carry current, the anti-reflective structure should have a reflectivity of 2% or less. For sensitive applications, including devices that have very narrow specifications for parameters, such as conductivity or resistance, the anti-reflective structure should have a reflectivity of 1% or less, in the presence of the photoresist layer.

Although no particular theory is necessary to the invention, in connection with the present invention, it is theorized that a structure made from indium tin oxide will reflect very little light having a wavelength in the range of 190–300 nm due to the absorption of light by the anti-reflective structure 106 and the destructive interference of light reflected at the interfaces between the anti-reflective structure 106 and its neighboring layers 102, 108. Based on this theory, the appropriate thickness of the anti-reflective structure can be determined by a variety of techniques.

Using well-known physical principles and measurements of the index of refraction, n, and the extinction coefficient, k, of indium tin oxide, as well as typical indices of refraction for the photoresist layer (1.5–1.75), it has been determined that, for example, an anti-reflective layer made of indium tin oxide with a thickness of 200–290 angstroms acts as an anti-reflective structure with the desired reflectivity characteristics. The appropriate thickness, however, may vary with the particular indium tin oxide stoichiometry and the wavelength of light which is used to expose the photoresist.

Figure 2A:
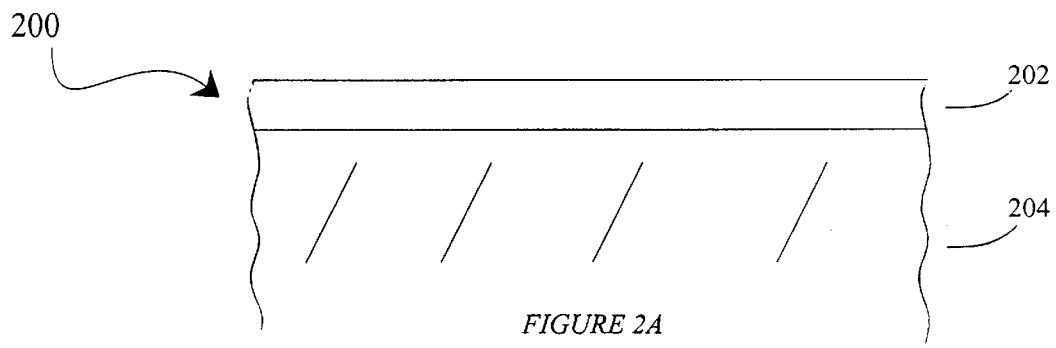
FIGS. 2A–2F illustrate another exemplary process for patterning a metal layer of a semiconductor device using an anti-reflective layer with multiple sublayers according to the present invention.

Another embodiment of an exemplary process is illustrated in FIGS. 2A–2F. The same techniques, methods, materials, and considerations apply to this process as in the process described with reference to FIGS. 1A–1E, unless otherwise noted. A semiconductor device 200 has a metal layer 202 formed on a substrate 204, as illustrated in FIG. 2A.

Figure 2B:
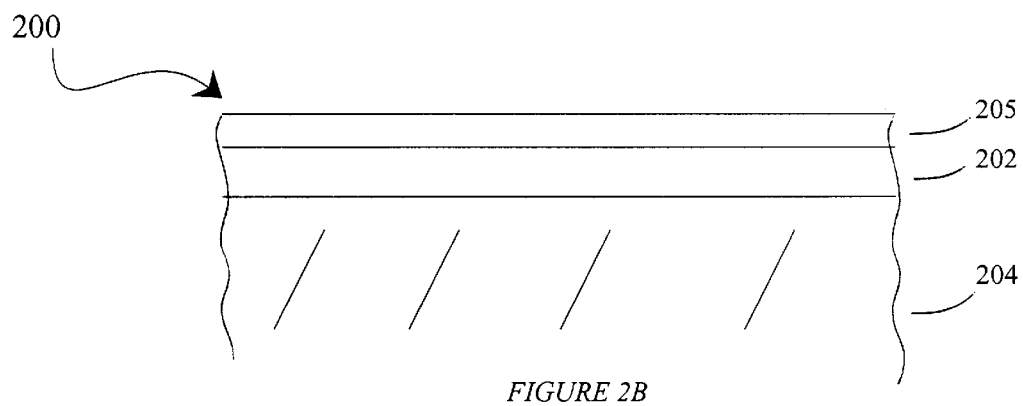
Figure 2C:
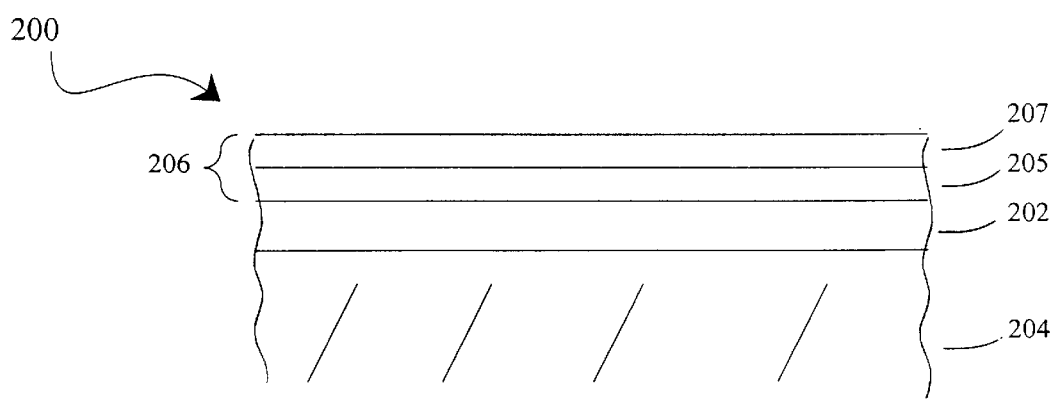

An anti-reflective structure 206 is formed over the metal layer, as illustrated in FIGS. 2B–2C. The anti-reflective structure 206 has two sublayers 205, 207. The first sublayer 205 is made of titanium nitride. The titanium nitride may be stoichiometric or nonstoichiometric. The second sublayer 207 is made of indium tin oxide, which may also be stoichiometric or nonstoichiometric, as described hereinabove. Both sublayers 205, 207 can be formed by a variety of techniques, including, for example, sputtering, chemical vapor deposition, and physical vapor deposition. The two sublayers 205, 207 work in combination to provide an anti-reflective structure 206 with the desired reflectivity characteristics.

Figure 2D:
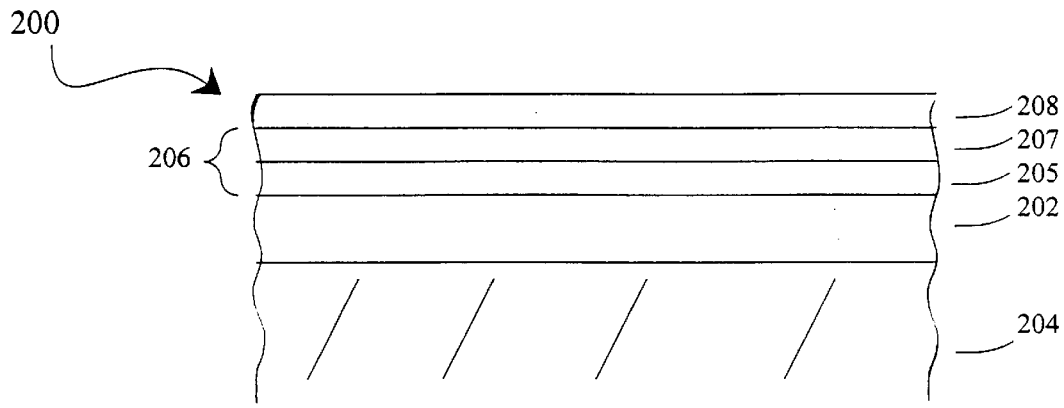
Figure 2E:
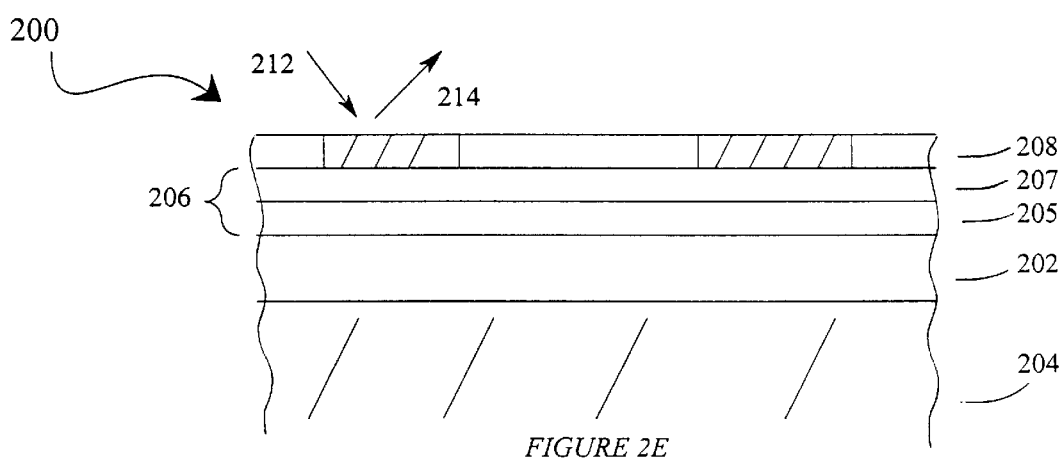
Figure 2F:
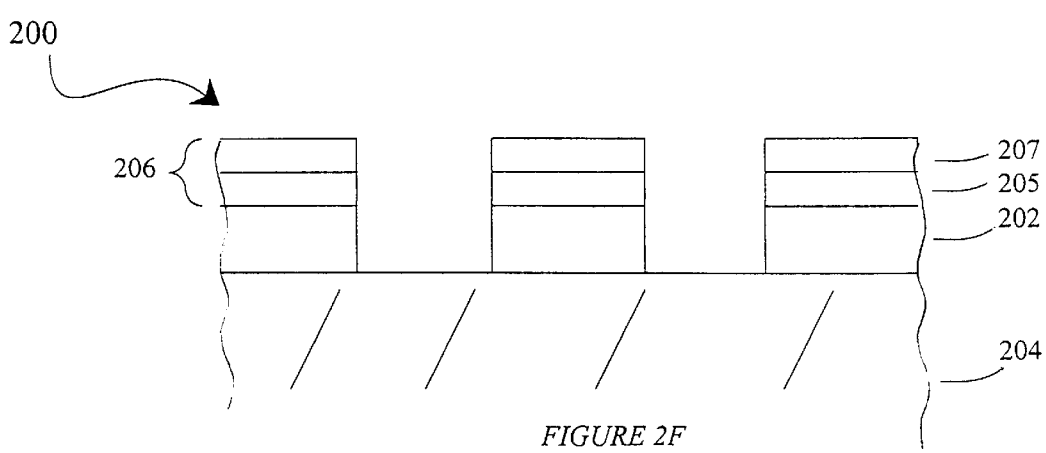

Following the formation of the anti-reflective structure 206, a photoresist layer 208 is formed over the anti-reflective structure 206, as shown in FIG. 2D, and then patterned using a mask and exposure to light 212 of a particular wavelength, as illustrated in FIG. 2E. The photoresist layer 208 is developed and portions of the anti-reflective structure 206 and metal layer 202 are removed according to the desired pattern, as shown in FIG. 2F.

Again, the appropriate thicknesses for the two sublayers 205, 207 of the anti-reflective structure 206 can be determined by a variety of methods. Using well-known physical principles and measurements of the index of refraction, n, and the extinction coefficient, k, of indium tin oxide and titanium nitride, as well as typical indices of refraction for the photoresist layer (1.5–1.75), it has been determined that, for example, an anti-reflective structure 206 with a titanium nitride sublayer 205 having a thickness of about 100–500 angstroms and an indium tin oxide sublayer with a thickness of about 150–320 angstroms acts as an anti-reflective structure with the desired reflectivity characteristics. The appropriate thicknesses may vary with the particular indium tin oxide and titanium nitride stoichiometry and the wavelength of light which is used to expose the photoresist.

As another example, it has been determined that for 248 nm light, a titanium nitride sublayer 205 having a thickness of about 100–170 angstroms and a indium tin oxide sublayer 207 having a thickness of about 150–250 angstroms provides an anti-reflective structure with a reflectivity of 1% or less. For 193 nm light, it has been determined that a titanium nitride sublayer 205 having a thickness of about 200–300 angstroms and a indium tin oxide sublayer 207 having a thickness of about 160–400 angstroms provides an anti-reflective structure with a reflectivity of 1% or less.

An additional advantage of the indium tin oxide or indium tin oxide/titanium nitride anti-reflective structures is that both indium tin oxide and titanium nitride are conducting (although indium tin oxide is about 3–4 times less conductive than titanium nitride), therefore, the anti-reflective structure need not be removed from the metal layer as a conductive path can still be provided through the anti-reflective structure. Other suggested structures, such as SiON or silicon nitride, are not conductors and must typically be removed. In addition, the anti-reflective structure can also prevent the etching of the underlying metal layer during a subsequent via etch.

As noted above, the present invention is applicable to the fabrication of a number of different devices where a metal layer is formed and patterned over a substrate. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification. The claims are intended to cover such modifications and devices.

We claim:

1. A semiconductor device, comprising:
   a substrate;
   a metal layer formed over the substrate;
   an anti-reflective structure formed over the metal layer, the anti-reflective structure comprising indium tin oxide;
   a photoresist layer formed over the anti-reflective structure, wherein the anti-reflective structure, in the presence of the photoresist layer, reflects less than about 3% of light having a wavelength within the range of 190–300 nm.

2. The device of claim 1, wherein the anti-reflective structure has a thickness of about 200–290 angstroms.

3. The device of claim 1, wherein the anti-reflective structure comprises:
   a first anti-reflective layer formed over the metal layer, the first anti-reflective layer comprising titanium nitride; and
   a second anti-reflective layer formed over at least a portion of the first anti-reflective layer, the second anti-reflective layer comprising indium tin oxide.

4. The device of claim 3, wherein the first anti-reflective layer has a thickness of about 100–500 angstroms.

5. The device of claim 3, wherein the second anti-reflective layer has a thickness of about 150–320 angstroms.

6. The device of claim 3, wherein the structure reflects less than about 1% of light having a predetermined wavelength in the range of 190–300 nm when the photoresist layer is formed over the structure.

7. The device of claim 3, wherein the indium tin oxide contains nonstoichiometric amount of oxygen.

8. A device comprising:
   a substrate;
   a metal layer formed over the substrate;
   an anti-reflective structure formed over the metal layer, the anti-reflective structure comprising indium tin oxide and having a thickness of 200–290 angstroms;
   a photoresist layer formed over the anti-reflective structure, wherein the anti-reflective structure, in the presence of the photoresist layer, reflects less than 3% of light having a wavelength within the range of 190–300 nm.

9. A device comprising:
   a substrate;
   a metal layer formed over the substrate;
   an anti-reflective structure formed over the metal layer, the anti-reflective structure comprising
      a first sublayer formed over the metal layer, the first sublayer comprising titanium nitride and having a thickness of 100–500 angstroms, and
      a second sublayer formed over the first sublayer, the second sublayer comprising indium tin oxide and having a thickness of 150–320 angstroms,
   a photoresist layer formed over the anti-reflective structure, wherein the anti-reflective structure, in the presence of the photoresist layer, reflects less than 3% of light having a wavelength within the range of 190–300 nm.

10. A semiconductor device, comprising:
    a substrate;
    a metal layer formed over the substrate;
    an anti-reflective means formed over the metal layer for reflecting incident light;
    a photoresist layer formed over the anti-reflective layer, wherein the anti-reflective means, in the presence of the photoresist layer, reflects less than about 3% of light having a wavelength within the range of 190–300 nm.

11. A semiconductor device, comprising:
    a substrate;
    a metal layer formed over the substrate;
    an anti-reflective structure formed over the metal layer, the anti-reflective structure comprising indium tin oxide, wherein the anti-reflective structure, in the presence of a photoresist layer disposed over the anti-reflective structure, reflects less than about 3% of light having a predetermined patterning wavelength within the range of 190 to 300 nm.

12. The device of claim 11, wherein the anti-reflective structure has a thickness of about 200 to 290 angstroms.

13. The device of claim 11, wherein the anti-reflective structure comprises:
    a first anti-reflective layer formed over the metal layer, the first anti-reflective layer comprising titanium nitride; and
    a second anti-reflective layer formed over at least a portion of the first anti-reflective layer, the second anti-reflective layer comprising indium tin oxide.

14. The device of claim 13, wherein the first anti-reflective layer has a thickness of about 100 to 500 angstroms.

15. The device of claim 13, wherein the second anti-reflective layer has a thickness of about 150 to 320 angstroms.

16. The device of claim 13, wherein the anti-reflective structure reflects less than about 1% of light having a predetermined wavelength in the range of 190 to 300 nm in the presence of a photoresist layer disposed over the anti-reflective structure.

17. The device of claim 11, wherein the anti-reflective structure, in the presence of a photoresist layer, reflects less than 2% of light having a predetermined wavelength in the range of 190 to 300 nm.

18. The device of claim 11, wherein the anti-reflective structure, in the presence of a photoresist layer, reflects less than about 2% of light having a wavelength of 248 nm.

19. The device of claim 11, wherein the anti-reflective structure, in the presence of the photoresist layer, reflects less than about 2% of light having a wavelength of 193 nm.

20. The device of claim 11, wherein the indium tin oxide contains a ratio of indium to tin between about 80:20 and about 95:5.

21. The device of claim 11, wherein the indium tin oxide contains nonstoichiometric amount of oxygen.

22. The device of claim 21, wherein the indium tin oxide is oxygen deficient.

23. A device comprising:
    a substrate;
    a metal layer formed over the substrate;
    an anti-reflective structure formed over the metal layer, the anti-reflective structure comprising indium tin oxide and having a thickness of 200 to 290 angstroms.

24. A device comprising:
    a substrate;
    a metal layer formed over the substrate; and
    an anti-reflective structure formed over the metal layer, the anti-reflective structure comprising
       a first sublayer formed over the metal layer, the first sublayer comprising titanium nitride and having a thickness of 100 to 500 angstroms, and
       a second sublayer formed over the first sublayer, the second sublayer comprising indium tin oxide and having a thickness of 150 to 320 angstroms.

* * * * *

UNITED STATES PATENT AND TRADEMARK OFFICE
CERTIFICATE OF CORRECTION

PATENT NO. : 6,057,587

DATED : May 2, 2000

INVENTOR(S) : Ghandehari et al.

It is certified that error appears in the above-identified patent and that said Letters Patent is hereby corrected as shown below:

Col. 7, line 7: "3" should read --1--.

Signed and Sealed this

Third Day of April, 2001

*Attest:*

NICHOLAS P. GODICI

*Attesting Officer*  *Acting Director of the United States Patent and Trademark Office*